United States Patent [19]

Addis et al.

[11] Patent Number: 4,725,790
[45] Date of Patent: Feb. 16, 1988

[54] BROADBAND DC LEVEL SHIFT CIRCUIT WITH FEEDBACK

[75] Inventors: John L. Addis, Beaverton; Patrick A. Quinn, Aloha, both of Oreg.

[73] Assignee: Tektronix, Inc., Beaverton, Oreg.

[21] Appl. No.: 917,865

[22] Filed: Oct. 14, 1986

[51] Int. Cl.⁴ .............................................. H03F 3/45
[52] U.S. Cl. ..................................... 330/258; 330/261
[58] Field of Search ........... 307/264, 491, 494, 296 R; 330/258, 252, 260, 261

[56] References Cited

U.S. PATENT DOCUMENTS 4,551,642 11/1965 Aizawa et al. ...................... 307/264

*Primary Examiner*—Gene Wan
*Attorney, Agent, or Firm*—Mark L. Becker

[57] ABSTRACT

A DC level shift circuit includes a differential amplifier with a level shift stage. The level shift stage has two portions for transmitting the input signals forming the differential signal through the level shift stage. A current source transmits the input signals through the level shift stage. Transistors with impedances substantially equal to the current source impedances are cross coupled to each input terminal. Each transistor senses a distortion signal produced by the current source impedance at one terminal and produces in response a correction signal. The correction signal is then transmitted to the other input terminal to be summed with the distortion signal there to pass the input signals through the level shift stage without distortion. The DC level shift stage is also responsive to another correction signal generated by a feedback control stage to control the common mode voltage of the amplifier.

10 Claims, 2 Drawing Figures

BROADBAND DC LEVEL SHIFT CIRCUIT WITH FEEDBACK

FIELD OF THE INVENTION

This invention relates generally to DC voltage level shift circuits. More particularly, this invention relates to such a shift circuit within a DC coupled amplifier for shifting the common mode output voltage of the amplifier to a predetermined reference level while preserving the signal's integrity across the broad bandwidth.

BACKGROUND OF THE INVENTION

An amplifying circuit is made up of a number of preamplifying stages coupled to a final amplifying stage that drives, an output device. In an integrated circuit, these preamplifying stages often consist of a difference amplifier that employs NPN emitter-coupled transistors because of their superior frequency response. The output signal from the difference amplifier is taken off the collectors of the transistors and therefore has a higher common mode voltage than the input signal applied at the bases. With several preamplifying stages coupled directly together, the common mode output voltage at the output of the last stage is considerably higher than the common mode input voltage at the input of the first stage.

This increase in the common mode voltage must be remedied in most amplifying circuits before the final output signal is produced. For one reason, the power supply typically has fixed voltage limits or "rails" that cannot be exceeded for the circuit to work properly. Because an input signal voltage is added to the common mode voltage, the common mode voltage must maintain a sufficient margin within the rails to prevent distortion of the input signal. For another reason, it is often desirable that the input and output common mode voltages be the same voltage, typically zero volts. This voltage is usually the center of the power supply limits and makes separately designed portions of a circuit compatible without additional coupling circuitry.

To correct the problem of the increasing common mode voltage, voltage level shift circuitry is employed between stages. One of the simplest level shifting techniques in the prior art is the use of a capacitor to AC couple two amplifying stages together. The DC voltage is separately supplied in the second stage at a predetermined level to ensure that the common mode voltage is at desired level. AC coupling, however, cannot be used in circuits where the DC voltage forms an important part of the input signal because it eliminates that portion of the input signal. For example, in oscillography, it is desirable to display for analysis the slow variation of the DC portion of the input signal as well as the higher frequency portion.

A simple level shift circuit that includes DC coupling can be a Zener diode, coupled between the output of a first stage and the input of a second stage. A Zener diode, however, is extremely noisy, producing a random series of large noise spikes that degrade the integrity of the input signal. Compounding the noise problem is the location of the voltage level shifting in the preamplifying stages of a circuit. The noise generated by the Zener diode is amplified through all the stages. A Zener diode is also temperature dependent so that the amount of voltage drop across the diode changes as its temperature changes. These two effects render the gain nonlinear.

Another level shifting technique employs pn diodes in series, with a specific number chosen to obtain the desired voltage level shift. Series diodes do not generate the noise of the Zener diode, but they are highly temperature dependent, varying on the average of 2 mv/° C. For example, if a five diode series were employed to shift the quiescent voltage of an amplifier 3.5 volts, the overall voltage shift could vary by up to 10 mv/° C. A ten-degree change in temperature would cause the shift to vary 100 mv, or about 3% of the desired voltage shift. Diodes are also inductive, causing the impedance of the level shift circuitry to vary with frequency. The gain across the diodes is therefore nonlinear.

A third voltage level shift technique employs a resistor coupled between amplifying stages. A known current is drawn through the resistor to establish a predetermined voltage drop. The common mode output voltage of the first stage is applied at the high voltage end of the resistor, and the input voltage to the second stage is taken from the low voltage end. This technique, though simple in design, has major drawbacks. For one, a high-valued resistor limits the bandwidth of the level shifting and therefore introduces nonlinearities into the gain of the overall circuit at a low frequency. Decreasing the value of the resistor to broaden the bandwidth, however, requires that the current be increased proportionately to maintain the same voltage drop. But current in an integrated circuit cannot exceed a relatively low level or power consumption and dissipation become unacceptable. For another reason, the time constant of the parasitic capacitances in the integrated circuit and the input resistance of a current source must be balanced to maintain a linear gain by a time constant of the resistor and capacitance added in parallel. The input resistance of the current source is difficult to determine in an integrated circuit, which makes calculation of the required capacitance extremely difficult.

A fourth popular technique for level shifting employs a $V_{be}$ multiplier transistor circuit. By varying the resistances coupled between the collector and the base and the base and the emitter, the voltage drop across the level shifting transistor can be made to be any desired coefficient of $V_{be}$ within the limits of the power supply. This technique allows for greater accuracy in level shifting but suffers from the same temperature dependency and inductive effect as the series pn diodes circuit.

The inherent drawbacks of the prior art voltage level shift circuits such as these have limited the bandwidth of the amplifiers. The level shift circuit according to the present invention avoids these drawbacks and maintains linear gain for an amplifier across a broad bandwidth.

SUMMARY OF THE INVENTION

An object of the invention, therefore, is to provide an improved DC level shift circuit.

Another object of the invention is to provide the improved DC level shift circuit within a DC coupled amplifier.

Still another object of the invention is to shift the common mode voltage to a predetermined level at the output of the level shift circuit.

Yet another object of the invention is to change continuously the voltage level shift to produce a common mode output voltage level in predetermined relation to a reference voltage level regardless of the shift in the input common mode voltage level.

To achieve these objects, a DC voltage level shift circuit compensates for distortions that occur in shifting a DC voltage level. The shift circuit includes a voltage level shift stage for receiving input signals and shifting the DC voltage level. A current source transmits the input signal through the voltage level shift stage. Distortion signals that occur at the current source are corrected by a signal means that produce a correction signal to be summed with the distortion signal. The input signal can then pass through the level shift stage without distortion.

For a differential signal, the level shift stage has two input terminals for receiving the two opposite signals forming the differential signal. The current source provides currents at each terminal. In such a circuit, the signal means comprises a transistor whose input impedance substantially equals the input impedance of the current source at each terminal. The base of each transistor is coupled to the voltage level shift stage to apply the input signal voltage at one input terminal across the transistor input impedance to produce a correction current. The collector of the transistor is coupled to the other terminal. The correction current is transmitted to the other input terminal to be summed with a distortion current of equal amount but opposite sign produced by the input signal voltage being applied across the impedance of the current source at the other terminal.

The level shift circuit may be incorporated into a DC coupled amplifier. The amplifier may include means for summing the shifted input signal voltages to produce a common mode output voltage. A feedback control stage in communication with the voltage level shift stage compares the common mode voltage level to a predetermined reference voltage level and generates in response another correction signal. This correction signal is transmitted to the voltage level shift stage to change the amount of voltage level shift until the common mode voltage level is in predetermined relation to the reference voltage level.

The foregoing and other objects, features, and advantages of the invention will become more apparent from the following detailed description of two preferred embodiments which proceeds with reference to the accompanying drawings.

DETAILED DESCRIPTION

Figure 1:
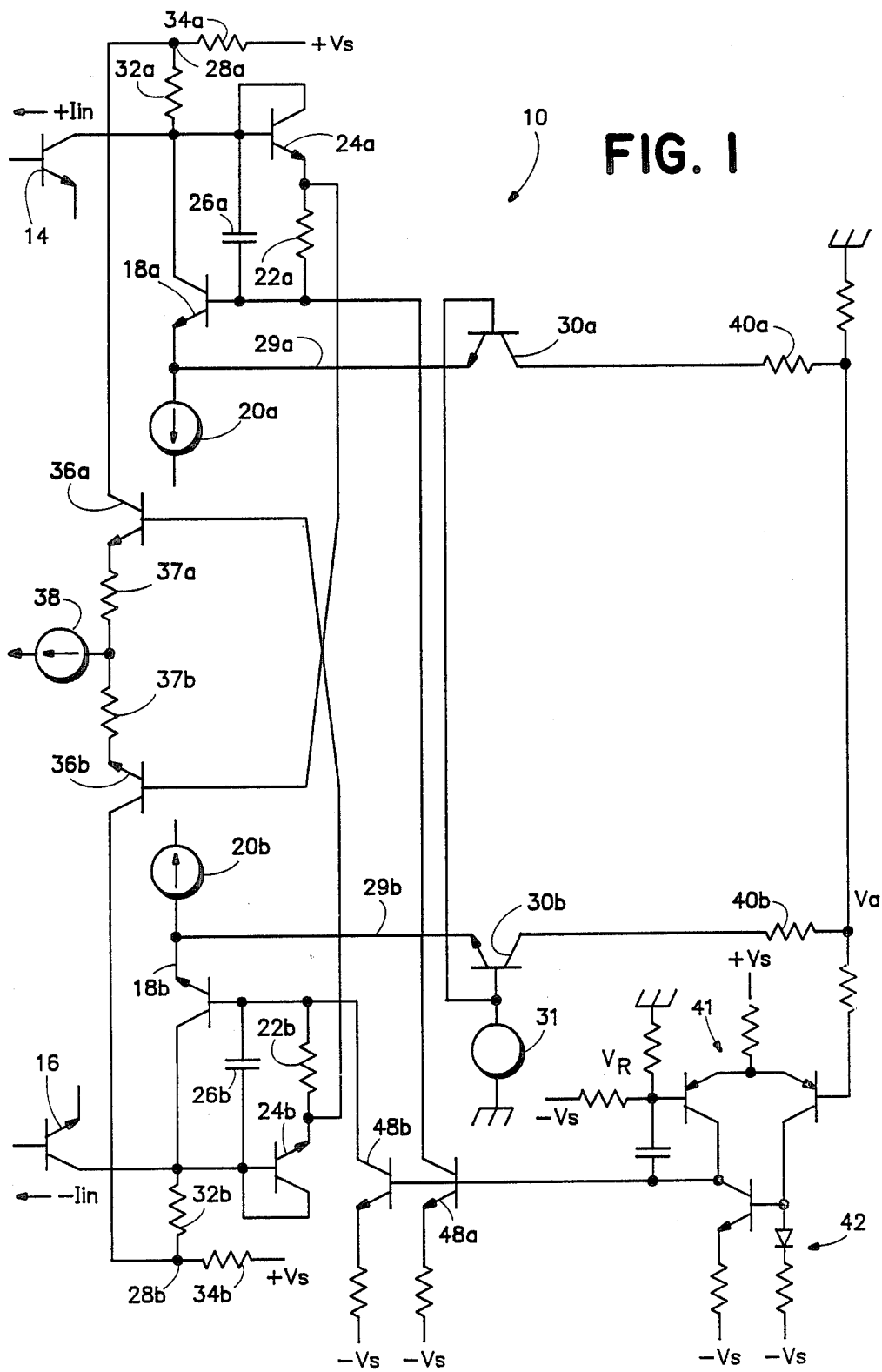
FIG. 1 is a schematic drawing of a DC coupled amplifier that includes a DC level shift circuit according to the invention.

FIG. 1 shows a schematic of a DC coupled difference amplifier 10 that includes a voltage level shift circuit according to the invention. The amplifier 10 receives at its input terminals a differential signal in the form of a pair of input signal currents, $+I_{in}$ and $-I_{in}$ from a preceding amplifying stage represented by transistors 14 and 16. The currents have both a standing or bias portion and an input signal portion.

The input signal currents $+I_{in}$ and $-I_{in}$ are received at the input terminals by a voltage shift stage that comprises two identical portions, one portion receiving $+I_{in}$ and the other portion receiving $-I_{in}$. The first portion of the shift stage includes a transistor 18a biased by a fixed current source 20a, a series connected resistor 22a and diode 24a, and a compensating capacitor 26a. The collector of transistor 18a, the capacitor 26a and the series connected resistor 22a and diode 24a are coupled together at the input terminal of the amplifier 10. The opposite ends of the capacitor 26a and resistor 22a are coupled to the base of the transistor 18a.

The voltage level that is shifted is the DC bias or quiescent voltage within the amplifier 10. This voltage shift $V_L$ is measured from the input terminal to the emitter of transistor 18a, which is the output of the level shift stage. $V_L$ is then the voltage drop across resistor 22a, diode 24a, and the base emitter junction of transistor 18a:

$$V_L = I_s R_{22a} + 2V_{be}$$

where $I_s$ is the current through $R_{22a}$, as determined hereinafter, and $2V_{be}$ is the drop across the diode and base emitter junction of transistor 18a.

To avoid the drawbacks of prior resistance-base level shift circuits, the diode 24a is added to reduce the size of resistor 22a and thereby the noise generated by the resistance. The current source 20a does not affect the voltage level shift. The compensating capacitance, therefore, need only be calculated to balance the known parasitic capacitance of transistor 18a.

The second portion of a level shift stage is coupled to the other input terminal for receiving $-I_{in}$. It comprises transistor 18b, current source 20b, series resistor 22b and diode 24b, and capacitor 26b. The design of the second portion and the value of its elements are identical to the first portion. The only difference between the two portions is the polarity of the input signal portion of the signal current.

The differential signal is transmitted through the level shift stage by a current source having two portions 28a and 28b coupled respectively to the input terminals of amplifier 10. At the first input terminal $+I_{in}$ is drawn out, transferring the signal to the remaining current produced by current source 28a. The signal current then passes primarily through the collector of transistor 18a and out the emitter. Fixed current source 20a draws off an additional fixed amount of biased current, transferring the signal current to an output path 29a. The same signal current transfer from $-I_{in}$ occurs from the other input terminal to path 29b.

The base emitter junctions of transistors 18a and 18b each present an impedance to the signal currents flowing through the transistor to paths 29a and 29b. The signal currents encounter additional impedance where paths 29a and 29b meet an amplifying stage such as the common base amplifier represented by matched transistors 30a and 30b and biased by a voltage source 31. These impedances produce a nonlinear voltage that is reflected back through the level shift stage. At the input terminal of amplifier 10, this nonlinear voltage is applied across the impedance of the current source comprising, in the case of current source 28a, resistors 32a and 34a. The nonlinear voltage produces a nonlinear distortion current lost through the current source. If not corrected, the nonlinear voltage results in a nonlinear signal current which limits the signal bandwidth of the amplifier 10.

The current source portions 28a and 28b correct for this nonlinearity with means for producing a correction signal to be summed with the distortion signal produced by the current source. Such a means includes for current source portion 28a a transistor 36a with an emitter resistor 37a of an impedance substantially equal to the impedance of the current source 28a. The collector of transistor 36a is coupled to the current source 28a between resistors 32a and 34a and the base of the transistor is cross coupled to the second portion of the level shift stage between the diode 24b and the resistor 22b. A matched transistor 36b and resistor 37b are similarly coupled to the current source 28b and the first portion of the level shift stage betwee diode 24a and resistor 22a. The transistors 36a and 36b are biased by a current source 38. Any change in the signal current at the first input terminal due to voltage applied across the impedance of current source 28a is matched by a corresponding current of opposite polarity at the second terminal due to identical current source 28b. The voltage change at the first input terminal is applied across transistor 30b and resistor 32b to produce a correction current that is supplied to the second input terminal to be summed with the distortion current through the resistors 32a and 34a. The voltage change at the second input terminal is applied across transistor 30a and resistor 32a to produce a correction current supplied to the first input terminal to be summed with the distortion current through resistors 32b and 34b. With equal voltages supplied across equal impedances, the correction currents are substantially equal to but opposite in sign to the nonlinear distortion currents with which they are summed. The net result is no input signal current is lost through the current sources 28a and 28b.

The signal currents pass through transistors 30a and 30b and through equal resistors 40a and 40b to produce voltages proportional to the input signal currents. These voltages are then summed to produce a common mode voltage $V_a$ for the amplifier 10. The voltage $V_a$ is controlled by a feedback control stage that includes a difference amplifier 41 and a current source 42. At the amplifier 41, $V_a$ is compared with a reference voltage $V_r$ to produce a correction signal proportional to the difference between the voltages and transmit the signal to transistors 48a and 48b. The collectors of these two transistors are coupled to the bases of transistors 18a and 18b respectively. The correction signal is transmitted through transistors 48a and 48b in the form of a change in the currents $I_s$ that are drawn through resistors 22a and 22b. Focusing on the first portion of the level shift stage, for example, the voltage across the resistor 22a increases as $I_s$ increases, increasing the voltage at the input terminal of amplifier 10. The change in $I_s$ therefore changes the amount of voltage shift $V_L$. This increase in the voltage at the input terminal decreases the standing current of current source 28a. This decrease in the standing current is passed through the level shift stage to the emitter of transistor 18a. With current source 20a pulling a fixed current from the level shift stage, the decrease in emitter current is made up by an increase in the standing current in path 29a from amplifying stage 30a. This increased current causes an increased voltage drop across resistor 40a. The same result occurs in the second portion of the level shift stage so that $V_a$ decreases. A lower $V_a$ decreases $I_s$ and allows the voltage at the input terminal of amplifier 10 to fall correspondingly and increase standing current flow from the current sources 28a and 28b. This feedback control of the common mode voltage $V_a$ is continuous, thereby maintaining $V_a$ in predetermined relation to the reference voltage $V_r$. In this embodiment, the level of $V_a$ is set equal to the level of $V_r$.

Figure 2:
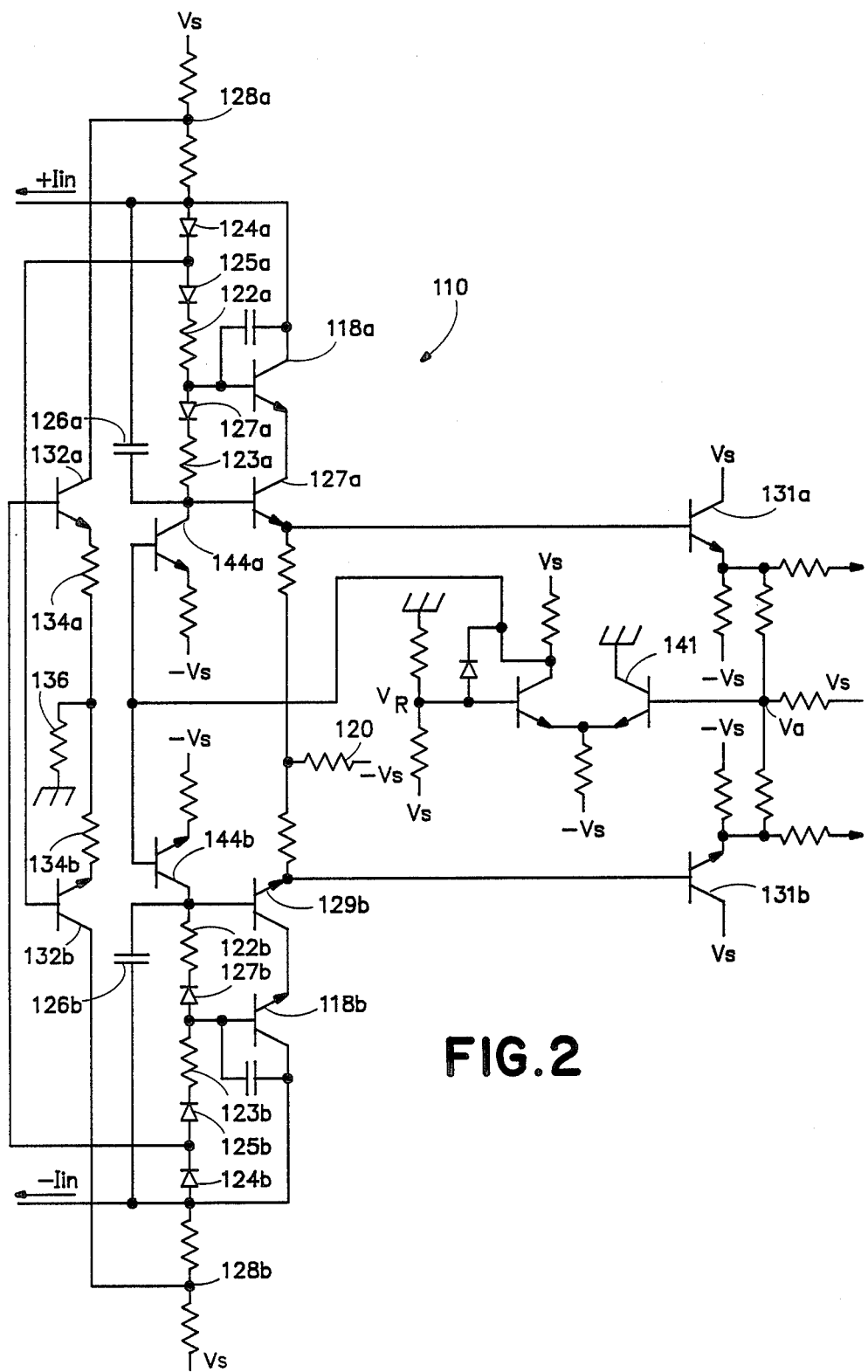
FIG. 2 is a second embodiment of a DC level shift circuit according to the invention.

FIG. 2 shows a second embodiment of a DC level shift stage according to the invention. As before, the first portion of the level shift stage comprises a transistor 118a and a current source 120 to bias the transistor. However, in place of a single diode and resistor, multiple resistors 122a and 123a are in series with multiple diodes represented by diodes 124a, 125a, and 127a. Also included is capacitor 126a. The level shift stage further includes a second transistor 129a from whose emitter the output signal current emerges at node 130a. Current is provided to the level shift stage by current source 128a. The second portion of the level shift stage has the same design as the first portion.

In contrast to the first embodiment, the voltages produced at emitter followers 131a and 131b are reflected back through the level shift stage to regulate $V_L$. The voltages at the input terminal of the amplifier 110 and the output of the level shift stage will rise and fall together in response to changes in the input signal current.

The current sources 128a and 128b include transistors 132a and 132b with resistors 134a and 134b respectively. Transistor 132a has its base coupled to the second portion of the level shift stage and its collector coupled to the current source 128b to produce and provide the correction current to the first input terminal. Similarly, transistor 132b has its collector coupled to current source 128a and its base coupled to the first portion of the level shift stage to produce and provide a correction current to the second input terminal. Transistors 132a and 132b are biased by current source 136.

The common mode voltage $V_a$ is formed by summing the voltages at the emitters of emitter followers 130a and 130b. $V_a$ is applied to a control feedback stage in communication with the voltage level shift stage. The feedback stage includes a difference amplifier 141 which produces a correction signal in response to a voltage difference between a reference voltage $V_r$ and $V_a$. The correction signal is transmitted to transistors 144a and 144b. These transistors each produce a current $I_s$ that adjusts the voltage drop across resistors 122a and 123a and resistors 122b and 123b to change $V_L$.

Having illustrated and described the principles of the invention in preferred embodiments, it should be apparent to those skilled in the art that the invention can be modified in arrangement and detail without departing from such principles. We claim all modifications coming within the spirit and scope of the following claims.

We claim:

1. A voltage level shift circuit comprising:
   a voltage level shift stage for receiving an input signal and shifting its voltage level;
   an impedance element coupled between said voltage shift stage and a power supply voltage, said impedance element having an intermediate tap; and
   a current source having a current proportional to said input signal, said current source coupled to said intermediate tap to thereby increase the effective impedance of said impedance element.

2. The circuit of claim 1 including a transistor having its emitter coupled to the output of the voltage level shift stage to minimize the reflection of voltage in the input signal.

3. A voltage level shift circuit comprising:
   a pair of voltage level shift stages for receiving two input signals forming a differential signal and shifting the voltage level thereof;
   a pair of impedance elements, each respectively coupled between each of said voltage shift stages and a power supply voltage, each of said impedance elements having an intermediate tap; and a current source having a pair of transistors each having a base, emitter and collector, the collectors each being respectively coupled to each of said intermediate taps, the bases each being respectively cross coupled to each of said input signals and the emitters being coupled to a bias current.

4. The circuit of claim 3 including:

means for summing the shifted input signal voltages to produce a common mode output voltage; and a feedback control stage in communication with each of the voltage level shift stages for comparing the common mode voltage level to a predetermined reference voltage level and generating in response a correction signal transmitted to each of the voltage level shift stages to change the amount of voltage level shift until the common mode voltage level is in a predetermined relation to the reference voltage level.

5. The circuit of claim 4 in which the control feedback stage includes a difference amplifier for comparing a reference voltage level against the common mode voltage level, the difference amplifier producing the correction signal in response to the difference between the reference and summed common mode voltage levels.

6. The circuit of claim 5 in which the controlled feedback stage includes a transistor current source receiving at its base the correction signal and transmitting the signal via the collector of the transistor by a corresponding change in current through the level shift stage to change the voltage level shift thereacross.

7. The circuit of claim 4 in which the voltage level shift stage includes a transistor receiving the input signal at its collector, the correction signal at its base, and providing the output signal at its emitter, the stage including a resistance coupled between the collector and the base so that the voltage level shift is at least the voltage drop across the resistance and across the base emitter junction of the transistor, the voltage shift changed by changing the voltage drop across the resistor via the correction signal.

8. The circuit of claim 4 including an amplifying stage coupled between the voltage level shift stage and the voltage summing means to amplify the input signal.

9. The circuit of claim 8 in which the amplifying stage is a variable gain stage.

10. A common mode voltage shift circuit for a differential signal, comprising:

a voltage level shift stage for receiving two input signals forming a differential signal and shifting the DC voltages of each input signal, the voltage shift stage responsive to a correction signal to change the amount of voltage level shift;

means for summing the two input signals to produce the common mode voltage; and a feedback control stage in communication with the voltage level shift stage for comparing the common mode voltage level to a predetermined reference voltage level and producing in response the correction signal transmitted to the voltage level shift stage to change the amount of voltage level shift until the common mode voltage level is in a predetermined relation to the reference voltage level.

* * * * *